United States Patent [19]
Tanaka et al.

[11] Patent Number: 5,688,358
[45] Date of Patent: Nov. 18, 1997

[54] R.F. PLASMA REACTOR WITH LARGER-THAN-WAFER PEDESTAL CONDUCTOR

[75] Inventors: Yoichiro Tanaka; Megumi Taoka, both of Narita, Japan; Barney Cohen, Santa Clara, Calif.

[73] Assignee: Applied Materials, Inc., Santa Clara, Calif.

[21] Appl. No.: 400,329

[22] Filed: Mar. 8, 1995

[51] Int. Cl.$^6$ ................................................ H01L 21/00
[52] U.S. Cl. ............ 156/345; 156/643.1; 156/646.1; 216/67
[58] Field of Search ............... 156/345 P, 643.1, 156/646.1; 216/67

[56] References Cited

U.S. PATENT DOCUMENTS

| | | | |
|---|---|---|---|
| 4,844,775 | 7/1989 | Keeble | 156/345 P |
| 5,122,251 | 6/1992 | Campbell et al. | 156/345 P |
| 5,292,399 | 3/1994 | Lee et al. | 156/643.1 |
| 5,310,453 | 5/1994 | Fukasawa et al. | 156/643.1 |
| 5,356,515 | 10/1994 | Tahara et al. | 156/643.1 |
| 5,384,008 | 1/1995 | Sinha et al. | 156/643.1 |
| 5,401,356 | 3/1995 | Enami et al. | 156/643.1 |
| 5,498,313 | 3/1996 | Bailey et al. | 156/643.1 |

*Primary Examiner*—T. Tung
*Attorney, Agent, or Firm*—Michaelson & Wallace

[57] ABSTRACT

A pedestal for supporting a semiconductor substrate in an R.F. plasma reactor chamber includes a conductive disk platen having a diameter exceeding the diameter of the substrate so that an outer annular portion of the conductive disk platen provides a direct path of R.F. power from the plasma while a remaining inner portion of the conductive disk provides a path of R.F. power from the plasma through the substrate, an etch-resistant cover shielding the conductive platen from the plasma, a portion of the etch-resistant layer underlying the substrate, the etch-resistant cover including a raised disk overlying a central portion of the conductive disk platen and underlying the substrate and having a diameter less than the diameter of the substrate so that a peripheral portion of the substrate extends beyond the circumference of the raised disk, a recessed ring annulus overlying an outer portion of the conductive disk platen and having a top surface which is depressed below a top surface of the raised disk, an inner portion of the recessed ring annulus underlying the peripheral portion of the substrate, leaving a top portion of a side wall of the raised disk exposed to the plasma.

15 Claims, 7 Drawing Sheets

R.F. PLASMA REACTOR WITH LARGER-THAN-WAFER PEDESTAL CONDUCTOR

BACKGROUND OF THE INVENTION

1. Technical Field

The invention is related to a radio frequency (R.F.) plasma reactor which can perform a process such as etching, chemical vapor deposition and the like on a semiconductor wafer held within the reactor. In particular, the invention is related to an R.F. plasma reactor useful in etching, for example, and capable of producing a high D.C. bias at the wafer without suffering a concomitant loss in plasma uniformity.

2. Background Art

An R.F. plasma etch reactor may be employed to perform a so-called "pre-clean" etch step to clean native oxides from semiconductor or metal surfaces on a wafer. Typically, a native oxide must be removed from a small portion of a metal layer exposed through a contact window of an overlying dielectric (silicon dioxide) layer. Usually, for example, an inert gas such as Argon is introduced into the reactor chamber, a plasma is struck and an R.F. bias potential is imposed on the wafer to create a D.C. bias on the wafer which attracts Argon ions to sputter etch the native oxide. The energy of the Argon ions is determined by the bias potential on the wafer. If the aspect ratio of the contact window (i.e., the ratio of the opening depth to the contact opening diameter) is relatively large (e.g., about 3:1), then a very high D.C. bias on the wafer (e.g., 400 Volts) may be required to assure a complete removal of the native oxide. This is particularly true if the metal or polysilicon surface to be cleaned has a large amount of contamination thereon. Such a large aspect ratio is typical of semiconductor structures having multiple conductor layers connected by vias through an intervening dielectric layer.

A problem is that as the D.C. bias is increased to a desired level, the plasma ion density uniformity across the wafer surface decreases, particularly in the case of a wafer having a diameter of about 130 cm (i.e., 5 inches) or greater, which causes a corresponding degradation in etch rate uniformity. This problem is exacerbated at low etch rates. Poor plasma density uniformity across the wafer surface (e.g., on the order of 5%) reduces device yield on the wafer because of poor etch control and because the non-uniformity in the plasma ion density gives rise to non-uniform electrical forces acting on the wafer device structure which can damage devices on the wafer.

Another problem associated with an R.F. plasma etch reactor is the so-called "first wafer effect" in which the first wafer to be etched immediately after the reactor has been idle for a significant duration (e.g., several hours) is etched at a much slower rate than wafers etched immediately after the first wafer in the same reactor chamber. This etch rate degradation is due to the presence of moisture and impurities on the interior surfaces of the reactor chamber which are "burned off" by the plasma during the etching of the first wafer. Such impurities increase the number of atoms in the plasma, thereby raising the pressure and decreasing the plasma ion density, which decreases the etch rate. The impurities could be "burned-off" by striking a plasma before inserting the first wafer, but this would expose the conductive (aluminum or titanium) surface of the wafer pedestal normally covered by the wafer, thereby sputter etching the wafer pedestal which would prematurely degrade it and introduce metallic contamination by-products into the reactor chamber.

Thus, there is a need to produce a high D.C. bias in an R.F. plasma etch reactor without degrading plasma etch uniformity and there is a need to eliminate the so-called "first wafer effect".

SUMMARY OF THE INVENTION

The invention is embodied in a plasma reactor including a reactor chamber, a gas source for supplying a gas into the interior of the chamber, an R.F. source for supplying the interior of the chamber with electromagnetic energy so as to maintain a plasma of the reactant gas, and a wafer pedestal inside the chamber for supporting a wafer thereon. The wafer pedestal includes a conductive disk platen having a diameter exceeding the diameter of the wafer. An outer annular portion of the conductive disk platen provides a direct path of R.F. power from the plasma while a remaining inner portion of the conductive disk provides a path of R.F. power from the plasma through the wafer. An etch-resistant cover shields the conductive platen from the plasma. A portion of the etch-resistant cover underlies the wafer. The etch-resistant cover includes a raised disk overlying a central portion of the conductive disk platen and underlying the wafer. The etch-resistant cover has a diameter less than the diameter of the wafer so that a peripheral portion of the wafer extends beyond the circumference of the raised disk. A recessed ring annulus overlying an outer portion of the conductive disk platen has a top surface which is depressed below a top surface of the raised disk. An inner portion of the recessed ring annulus underlies the peripheral portion of the wafer, leaving a top portion of a side wall of the raised disk exposed to the plasma.

Preferably, the displacement between the top surface of the recessed ring annulus and the peripheral portion of the wafer is sufficient to permit the plasma to contact the entirety of the top surface of the recessed ring annulus. Also, the diameter of the raised disk preferably is less than the diameter of the wafer by an amount at least as great as wafer-to-wafer position variations on the wafer pedestal.

DETAILED DESCRIPTION OF THE PREFERRED EMBODIMENTS

Figure 1:
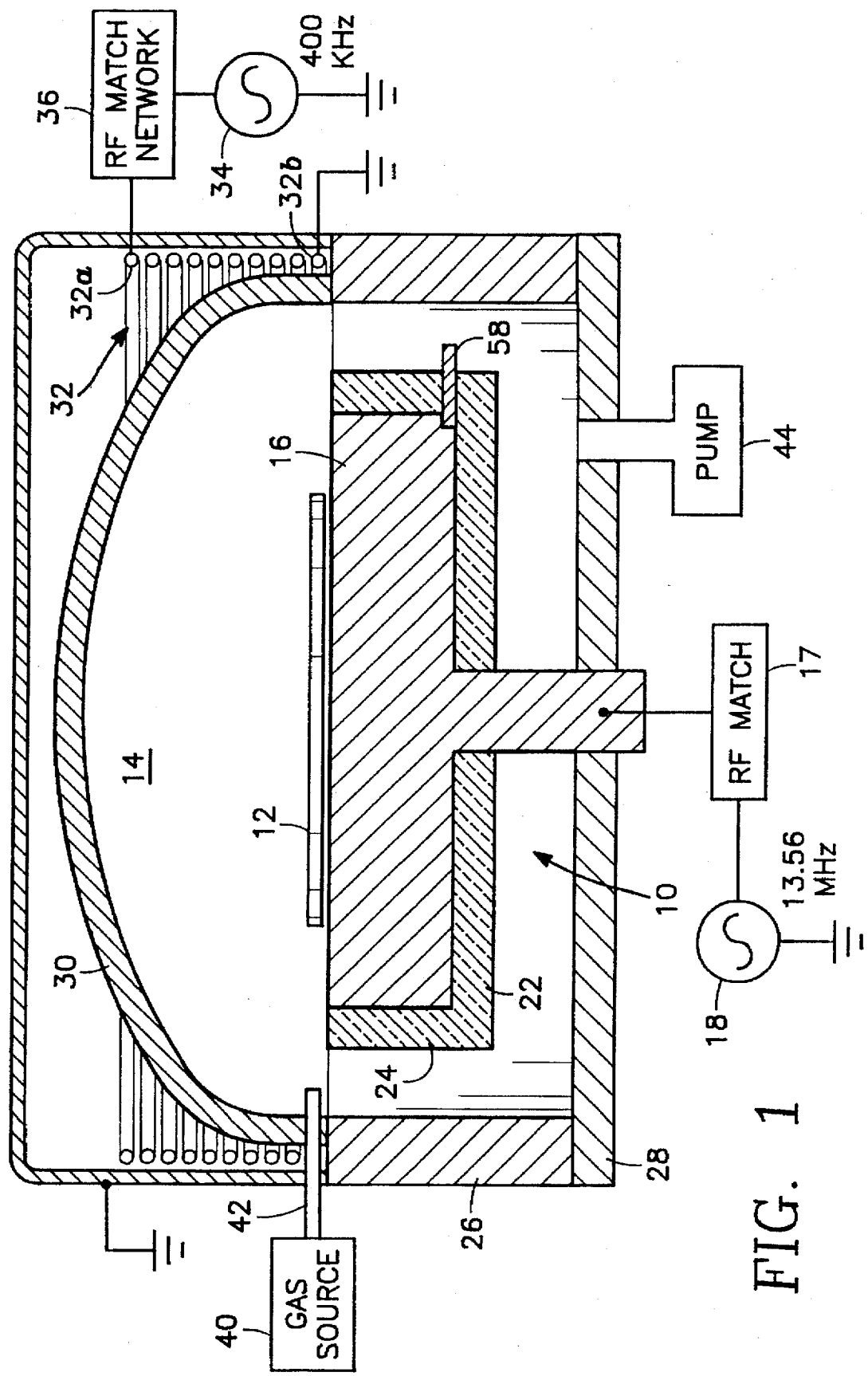
FIG. 1 is a simplified partially cut-away cross-sectional side view of an R.F. plasma reactor in accordance with a first embodiment of the invention.

Referring to the inductively coupled R.F. plasma etch reactor illustrated in FIG. 1, a wafer pedestal 10 supporting a wafer 12 inside a reactor chamber 14 includes a conductive (aluminum or titanium) platen 16 underlying the semiconductor wafer 12, the conductive platen 16 being connected through a conventional R.F. impedance match network 17 to a conventional bias R.F. power source 18 controlling the voltage on the pedestal 10 so as to control the plasma D.C. bias potential.

The plasma reactor chamber may include a cylindrical conductive side wall 26, a base 28 and a multi-radius quartz dome 30 resting on the top of the side wall 26. The top of the side wall is at approximately the same height as the wafer 12. The invention may be used with either a capacitively coupled plasma reactor (e.g., of the type having a pair of RF excited electrodes) or an inductively coupled plasma reactor. In the case of an inductively coupled plasma reactor, a cylindrical coil antenna 32 surrounding the dome 30 has its topmost winding 32a connected to an plasma R.F. power source 34 through an R.F. match network 36 (which may be included within the R.F. power source 34) and its lowest winding 32b connected to ground and being at about the same height as the wafer 12 and top of the side wall 26. A grounded R.F. shield 38 encloses the coil antenna 32. A gas source 40 provides a processing gas to the chamber 14 through a gas inlet 42. A pump 44 maintains the reactor chamber interior at a desired pressure.

In order to improve the uniformity across the wafer surface of the plasma ion density at a high plasma D.C. bias voltage, the conductive platen 16 has a diameter significantly greater than the wafer diameter (preferably about 15% greater), so that a significant portion of the conductive platen 16 extends out beyond the circumference of the wafer 12, providing a path between the D.C. bias power and the plasma around the circumference of the wafer 12.

Figure 2:
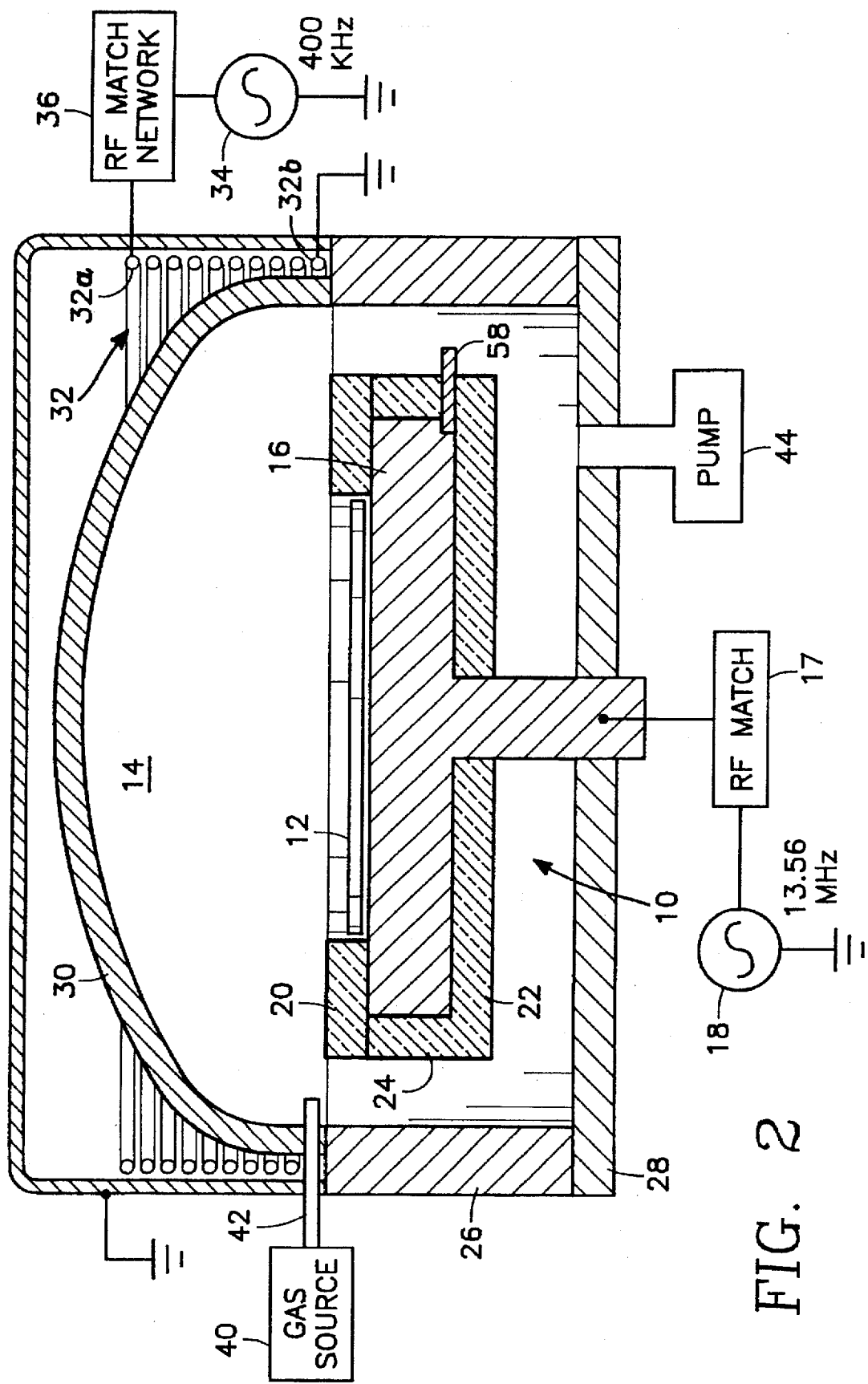
FIG. 2 is a simplified partially cut-away cross-sectional side view of an R.F. plasma reactor in accordance with a second embodiment of the invention.

Referring now to the embodiment of FIG. 2, the wafer pedestal 10 may additionally include a dielectric layer 20 (such as quartz) covering the exposed portion of the top face of the platen 16 (i.e., the annulus 16' of the platen surrounding the circumference of the wafer 12) in order to prevent sputtering of the exposed portion of the conductive platen 16.

Figure 3:
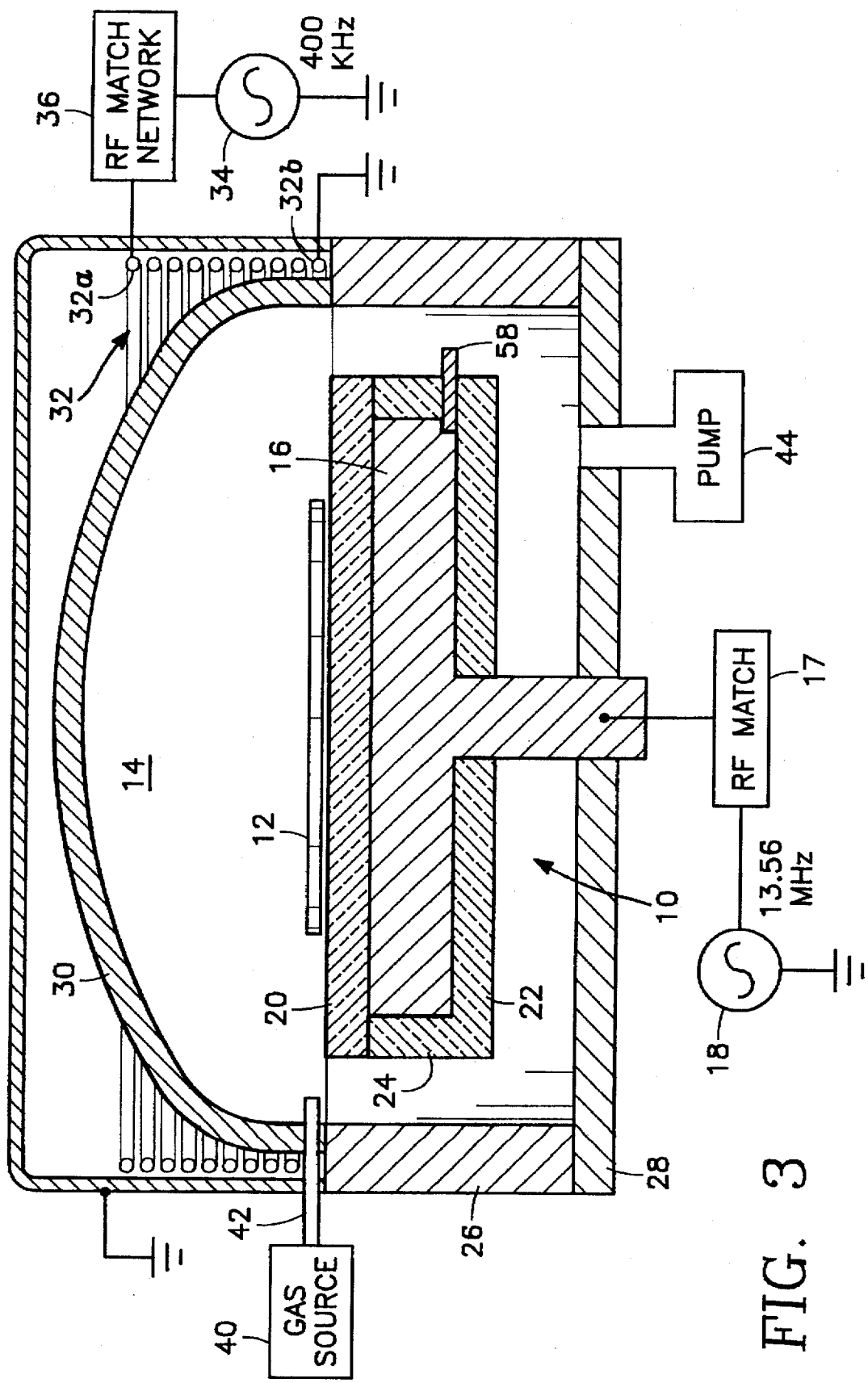
FIG. 3 is a simplified partially cut-away cross-sectional side view of an R.F. plasma reactor in accordance with a third embodiment of the invention.

As shown in FIG. 3, the dielectric layer 20 alternately may cover the entire top surface of the platen 16 so that the wafer 12 is not in direct electric contact with the platen. Instead, the wafer 12 is capacitively coupled through the dielectric cover 20 to the conductive platen 16. Protection of the conductive platen 16 is enhanced by a quartz disk 22 covering the bottom of the platen 16 and a quartz ring 24 surrounding the circumferential side surface of the conductive platen 16 and wedged between the dielectric cover 20 and the quartz disk 22. Preferably, the quartz disk 22 and the quartz ring 24 are formed as a single integral quartz element. The dielectric cover 20 is preferably about 1-2 mm thick. Decreasing the thickness of the dielectric cover 20 (e.g., to 1 mm) reduces RF power loss to the chamber walls. Increasing the thickness of the dielectric cover 20 (e.g., to 2 mm) provides more durability or greater wear against etching.

The embodiment of FIG. 1 has the advantage that the entire wafer bottom surface is held at the potential of the platen 16 by virtue of the direct electrical contact therewith, which minimizes or eliminates device damage due to build-up of potential differences across the wafer surface during plasma processing. The embodiment of FIG. 2 retains this advantage and has the additional advantage that process degradation by metallic contaminant by-products from plasma etching of the exposed portion 16' of the platen 16 is minimized or eliminated. The embodiment of FIG. 3 lacks the advantage of the FIG. 1 embodiment but instead has the advantage that the reactor may be conditioned prior to processing of the first wafer by striking a plasma before inserting a wafer into the chamber without damaging any portion of the platen 16. This eliminates the so-called "first-wafer effect", as will be described later in this specification.

One potential problem with the embodiment of FIG. 3 is that the plasma slowly etches the top surface of the exposed outer portion of the quartz cover 20. This leaves a raised un-etched region under the wafer. Successive wafers tend to be placed at slightly different lateral locations on the top surface of the quartz cover 20, providing a slightly different etch boundary on the quartz cover 20. The difference in wafer location arises because a robot mechanism is typically employed to place and remove the wafer in the chamber, the robot mechanism having an inherent uncertainty in its placement of each wafer on the pedestal 10. As a result, a jagged profile is etched into the top surface of the quartz cover 20 near the wafer periphery during the processing of a large number of successive wafers in the chamber 14. The problem is that the jagged profile can be a source of particle contamination in the reactor chamber 14.

Figure 4:
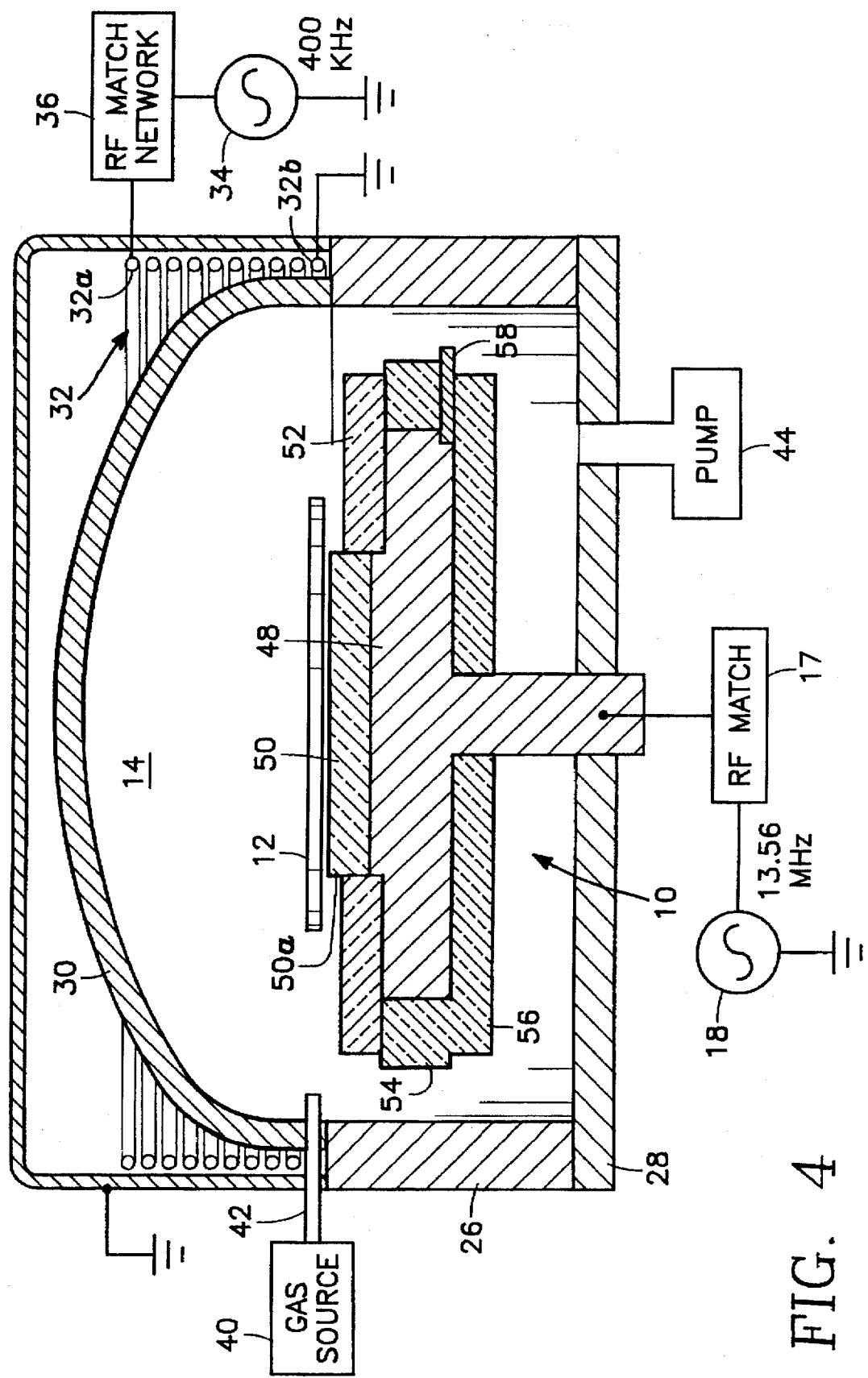
FIG. 4 is a simplified partially cut-away cross-sectional side view of an R.F. plasma reactor in accordance with a fourth embodiment of the invention.

In the embodiment of FIG. 4, this problem is overcome by providing quartz structure over a conductive wafer pedestal platen 48 which always has the same portions of the quartz structure exposed to etching by the plasma regardless of variations in the precise wafer location. Specifically, the wafer 12 rests on a raised center quartz disk 50 having a diameter slightly less than the wafer diameter (this slight difference being exaggerated in the drawing), the wafer 12 overhanging the quartz disk 50 by on the order of about 1 mm (but preferably not less than the maximum lateral wafer placement variation) to ensure that the quartz disk 50 is completely covered by the wafer 12 regardless of variations in lateral placement of the wafer. Preferably, the top surface of the quartz disk 50 extends above the top surface of a surrounding quartz top ring 52 by about 1–2 mm in order to avoid wafer contact with the surface of the quartz top ring 52. The quartz top ring 52 rests on a quartz outer ring 54 surrounding the circumferential side of the platen 48. The quartz outer ring 54 rests on a base disk 56 covering the bottom of the conductive platen 48. Preferably, the quartz outer ring 54 and the base disk 56 are formed as a single integral quartz element. The exposed portion 50a of the vertical side surface of the quartz disk 50 and the entire top surface of the quartz top ring 52 are always etched regardless of any side-to-side variation in wafer placement. The top surface of the quartz disk 50 is never etched regardless of any variations in side-to-side wafer placement as much as 1 mm. Therefore, the portions of the various quartz surfaces of the wafer pedestal never change so that the quartz surfaces which are exposed to the etchant are always the same surfaces. Consequently, they are etched uniformly so that the quartz surfaces remain relatively smooth without any formation of jagged edges regardless of variations in side-to-side wafer placement.

As the diameter of the exposed portion 50a is reduced, the wafer-to-wafer etch rate uniformity can suffer. The top quartz ring 52 is preferably about 2 mm thick for durability. The quartz disk 50 is preferably about 0.5 mm thick for RF power efficiency.

Preferably, three periodically spaced radially extending polysilicon antenna dowels 58 extend from an inner portion in contact with the conductive platen 48 to an outer portion in contact with the plasma. The radial antenna dowels 58 enable a reliable measurement of the D.C. bias induced on the wafer 12. This is because the dowels 58 keep the pedestal 10 at the same voltage as the wafer voltage, so that a measurement of the pedestal voltage is a reliable measurement of the wafer voltage. Otherwise, a charge build-up during plasma ignition (due to ion/electron mobility differences) produces a voltage difference that may impede the measurement of the wafer voltage.

Figure 5:
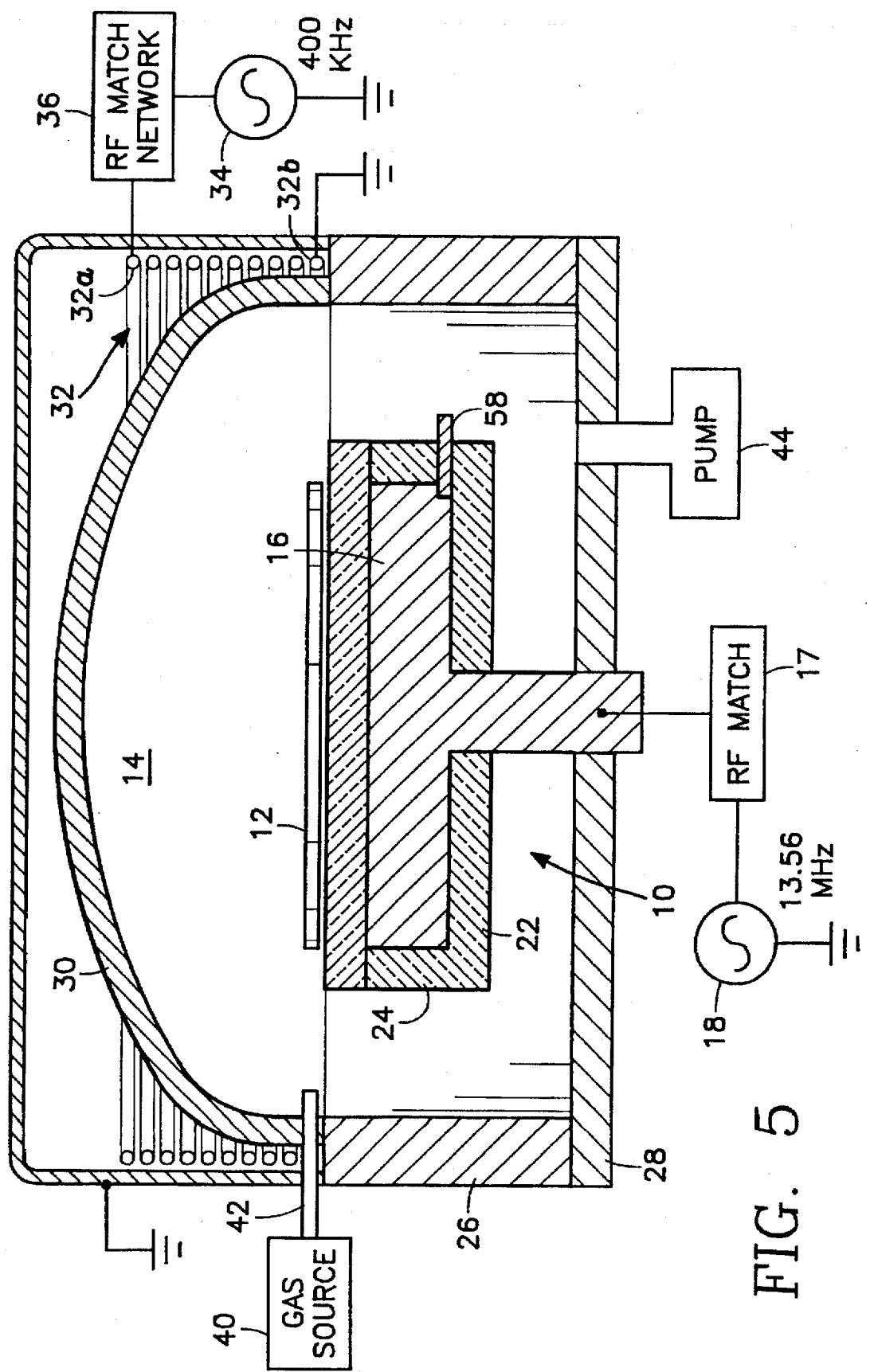
FIG. 5 is a simplified partially cut-away cross-sectional side view of an R.F. plasma reactor in accordance with a variation of the embodiment of FIG. 3.

FIG. 5 illustrates a variation of the embodiment of FIG. 3 in which the platen 16 does not extend beyond the circumference of the wafer 12.

The embodiments of FIGS. 1–4 solve the problem of non-uniform plasma density and etch rates at high plasma D.C. bias levels by providing a conductive wafer pedestal platen extending beyond the circumference of the wafer. This feature translates any edge effects associated with the circumference of the conductive wafer pedestal platen far beyond the wafer edge, so that such edge effects do not affect plasma ion density uniformity or etch rate uniformity on the wafer. The embodiments of FIGS. 3–5 also help solve the problem of the so-called "first wafer effect" by insulating the aluminum wafer pedestal with a quartz layer under the wafer. This feature permits the reactor chamber to be "burned-in" by striking a plasma (such as an Argon plasma) before insertion of the wafer and letting the plasma remove or sputter impurities from the interior chamber surfaces for several seconds or minutes before inserting the first wafer without damaging the aluminum portion of the wafer pedestal. Such "burning-in" prior to wafer insertion into the chamber may be performed each time the reactor is idled for any period of time, or once with the processing of each cassette of wafers, or with the processing of any lesser number of wafers (e.g., before processing any single wafer).

The embodiment of FIG. 4 has the additional advantage of avoiding formation of jagged quartz surfaces during etching of successive wafers, thereby avoiding a contamination problem associated with such quartz jagged edges.

Preferred Embodiment

Figure 6:
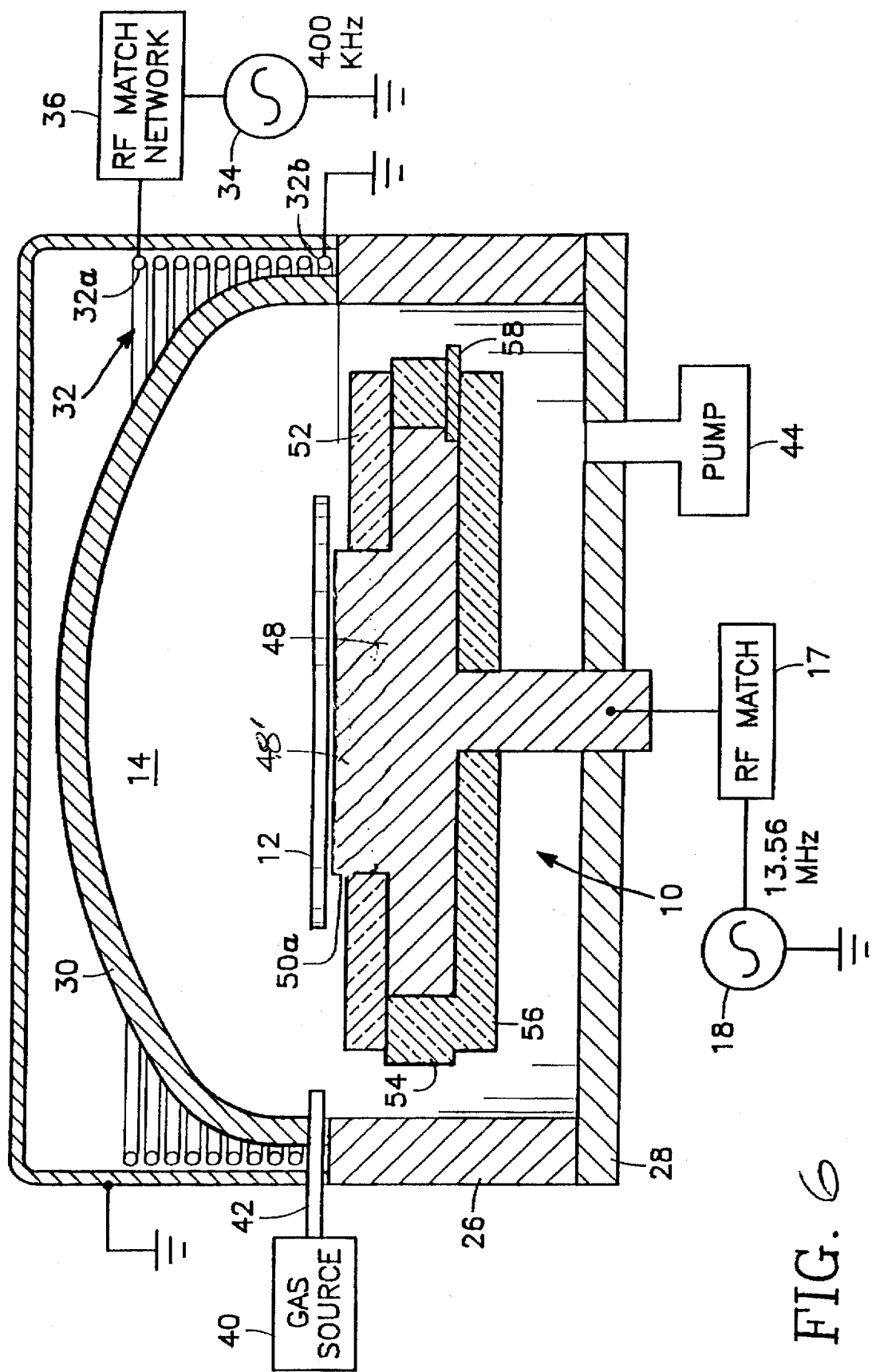
FIG. 6 is a simplified partially cut-away cross-sectional side view of the preferred embodiment of the invention.

The embodiment of FIG. 6 combines some of the advantages of the embodiments of FIGS. 1 and 4 and is the preferred embodiment. In FIG. 6, the conductive pedestal 48 includes a raised central portion 48' having a radius corresponding to that of the raised dielectric portion 50 of FIG. 4. In FIG. 6, the wafer 12 rests directly on the raised central conductive portion 48' so as to be in direct electrical contact to the pedestal 48. The advantage of such direct electrical contact between wafer and pedestal have already been discussed with reference to the embodiment of FIG. 1. As in the embodiment of FIG. 4, the raised central portion 48' permits the edges of the wafer 12 to overhang. The advantages of this overhang have already been discussed with reference to the embodiment of FIG. 4. However, it should be noted that since the conductive portion of the pedestal is not covered by a dielectric layer in FIG. 6 (for direct contact between the wafer and the pedestal conductive material), a "burn-in" procedure described previously herein with reference to the embodiment of FIG. 4, if performed in the embodiment of FIG. 6, would damage the pedestal and therefore is not one of the advantages enjoyed by the embodiment of FIG. 6.

In FIG. 6, the difference between the radii of the raised central portion 48' and the wafer 12 is about 0.1 inch (0.25 cm). The height of the raised control portion 48' above the remainder of the pedestal 48 is about 0.015 inch (0.038 cm). The thickness of the dielectric layer 52 is about 2 mm. A typical wafer is on the order of 0.025 inch thick (0.064 cm).

Figure 7:
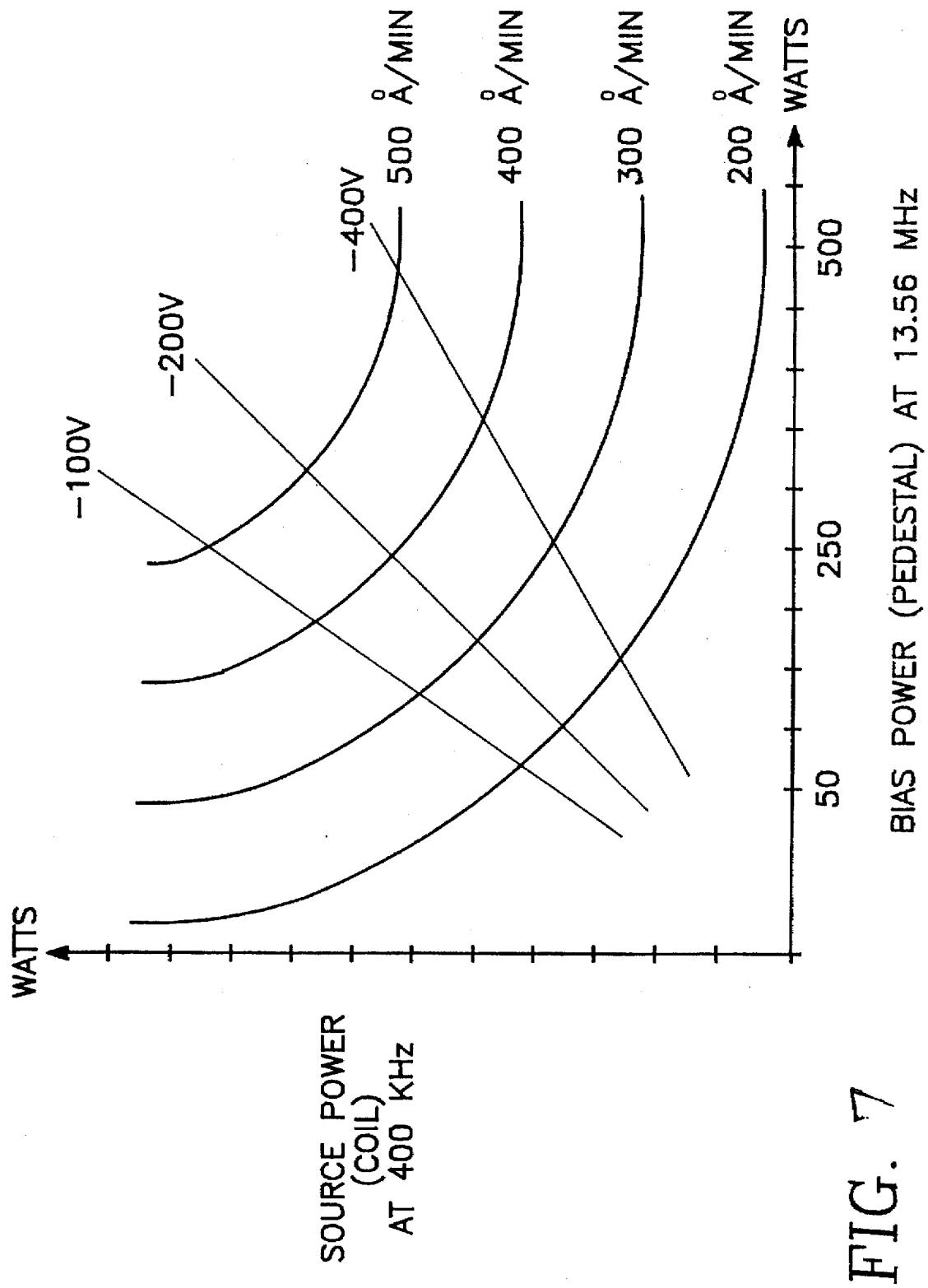
FIG. 7 is a graph of applied RF bias power versus applied RF plasma source power and illustrating lines of constant plasma DC bias and lines of constant etch rate, which described with reference to selecting the diameter of the wafer pedestal platen.

The use of independent R.F. power sources 18, 34 to supply the bias R.F. power on the wafer pedestal 10 and the plasma source power on the coil 32 permits the user to adjust the etch rate and D.C. bias separately. This is illustrated in FIG. 7, in which the power of the R.F. plasma source power 34 is plotted on the ordinate and the power of the R.F. bias source 18 is plotted on the abscissa. The diagonal straight lines emanating from the origin are lines of constant plasma D.C. bias voltages while the hyperbolic curves are curves of constant etch rates. As illustrated, any combination of etch rate and plasma D.C. bias voltage within a range may be selected by independently adjusting the power output by each of the R.F. sources 18, 34. The graph of FIG. 6 simply illustrates how to select a particular combination of etch rate and plasma D.C. bias voltage by independent adjustment of the two R.F. sources 18, 34. The extension of the conductive wafer pedestal platen 16 beyond the wafer diameter to promote plasma ion density uniformity across the wafer is most needed for high plasma D.C. bias voltages and low etch rates. Thus, as the user moves the processing parameters to the lower left quadrant of the graph of FIG. 6, the extension of the wafer pedestal platen 16 beyond the wafer circumference is preferably increased. In general, for an 8-inch wafer, the diameter of the platen 16 is between about 9 and 11 inches.

While the invention has been described in detail by specific reference to preferred embodiments, it is understood that variations and modifications thereof may be made without departing from the true spirit and scope of the invention.

What is claimed is:

1. A plasma reactor comprising:

a reactor chamber;

a gas source for supplying a process gas into the interior of said chamber;

a power applicator for coupling power into the interior of said chamber so as to create a plasma of said process gas;

a pedestal inside said chamber with a semiconductor substrate located thereon, said pedestal electrically connected to provide a return path for said power, said pedestal comprising:

a conductive disk platen for supporting said semiconductor substrate having a substrate diameter to be processed as a workpiece in said reactor, said platen having a diameter exceeding the diameter of said substrate so that an outer annular portion of said conductive disk platen provides a direct path for said power from said plasma while a remaining inner portion of said conductive disk provides a path for said power through said semiconductor substrate;

an etch-resistant cover shielding said conductive platen from said plasma, a portion of said etch-resistant cover underlying said substrate, said etch-resistant cover comprising:

an etch-resistant raised disk overlying a central portion of said conductive disk platen and underlying said substrate and having a diameter less than the diameter of said beyond the circumference of said raised disk, an etch-resistant recessed ring annulus overlying an outer portion of said conductive disk platen and having a top surface which is depressed below a top surface of said raised disk, an inner portion of said recessed ring annulus underlying said peripheral portion of said substrate, leaving a top portion of a side wall of said raised disk exposed to said plasma.

2. The reactor of claim 1 wherein a displacement between said top surface of said recessed ring annulus and said peripheral portion of said substrate being sufficient to permit said plasma to contact the entirety of said top surface of said recessed ring annulus.

3. The reactor of claim 1 wherein said diameter of said raised disk is less than said diameter of said substrate by an amount sufficient to allow said substrate to overlie a selected portion of said recessed ring annulus.

4. The reactor of claim 1 wherein said etch resistant cover, including said raised disk and said recessed ring, comprises a dielectric material.

5. The reactor of claim 4 wherein said etch-resistant cover further comprises:

a base disk covering a bottom surface of said conductive platen and having a peripheral annular portion thereof extending beyond the circumference of said conductive disk platen, said recessed ring annulus having a peripheral annular portion thereof extending beyond the circumference of said conductive disk platen;

an outer ring sandwiched between said peripheral annular portion of said base disk and said peripheral annular portion of said recessed ring annulus and covering a cylindrical side wall of said conductive disk platen.

6. The reactor of claim 5 wherein said base disk and said outer ring constitute a single integral quartz piece.

7. The reactor of claim 1 wherein said power applicator comprises an inductive coil antenna around a portion of said chamber and an R.F. plasma source power supply connected to said inductive coil antenna, said reactor further comprising:

a bias R.F. power supply connected to said conductive platen.

8. A pedestal in the interior of a plasma reactor vacuum chamber containing a plasma formed from a processing gas by applied R.F. power, said pedestal comprising:

a conductive disk platen with a semiconductor substrate located thereon and having a substrate diameter to be processed as a workpiece in said reactor, said platen having a diameter exceeding the diameter of said substrate so that an outer annular portion of said conductive disk platen provides a direct path of R.F. power from said plasma while a remaining inner portion of said conductive disk provides a path of R.F. power from said plasma through said substrate;

an etch-resistant cover shielding said conductive platen from said plasma, a portion of said etch-resistant cover underlying said substrate, said etch-resistant cover comprising:

an etch-resistant raised disk overlying a central portion of said conductive disk platen and underlying said substrate and having a diameter less than the diameter of said substrate so that a peripheral portion of said substrate extends beyond the circumference of said raised disk, an etch-resistant recessed ring annulus overlying an outer portion of said conductive disk platen and having a top surface which is depressed below a top surface of said raised disk, an inner portion of said recessed ring annulus underlying said peripheral portion of said substrate, leaving a top portion of a side wall of said raised disk exposed to said plasma.

9. The pedestal of claim 8 wherein a displacement between said top surface of said recessed ring annulus and said peripheral portion of said substrate being sufficient to permit said plasma to contact the entirety of said top surface of said recessed ring annulus.

10. The pedestal of claim 9 wherein said displacement is on the order of at least about 1 mm.

11. The pedestal of claim 8 wherein said diameter of said raised disk is less than said diameter of said substrate by an amount sufficient to allow said substrate to overlie a selected portion of said recessed ring annulus.

12. The pedestal of claim 11 wherein said amount is on the order of about 1 mm.

13. The pedestal of claim 8 wherein said etch resistant cover, including said raised disk and said recessed ring, comprises quartz.

14. The pedestal of claim 13 wherein said etch-resistant cover further comprises:

a base disk covering a bottom surface of said conductive platen and having a peripheral annular portion thereof extending beyond the circumference of said conductive disk platen, said recessed ring annulus having a peripheral annular portion thereof extending beyond the circumference of said conductive disk platen;

an outer ring sandwiched between said peripheral annular portion of said base disk and said peripheral annular portion of said recessed ring annulus and covering a cylindrical side wall of said conductive disk platen.

15. The pedestal of claim 14 wherein said base disk and said outer ring constitute a single quartz element.

* * * * *